United States Patent [19]

Takahashi

[11] 3,886,485

[45] May 27, 1975

[54] LINEAR VOLTAGE CONTROLLED OSCILLATOR INCLUDING A TIMING CAPACITOR CHARGED AND DISCHARGED THROUGH CURRENT MIRROR CIRCUITS

[75] Inventor: Nobuaki Takahashi, Yamato, Japan

[73] Assignee: Victor Company of Japan, Ltd., Yokohama, Japan Japan

[22] Filed: Nov. 19, 1973

[21] Appl. No.: 417,475

[30] Foreign Application Priority Data

Nov. 25, 1972 Japan ............................ 47-11836

[52] U.S. Cl. ......... 331/111; 331/108 D; 331/113 R; 331/177 R

[51] Int. Cl. ........................................ H03k 3/282

[58] Field of Search ........... 331/111, 113 R, 177 R, 331/108 D

[56] References Cited

UNITED STATES PATENTS 3,665,343 5/1972 Thompson ..................... 331/113 R 3,688,213 8/1972 Calaway ..................... 331/113 R X 3,794,934 2/1974 Rhee ............................ 331/111 X

*Primary Examiner*—Siegfried H. Grimm

[57] ABSTRACT

A linear voltage controlled oscillator comprises a pair of transistors having mutually connected emitters. The transistors switch "ON" and "OFF" alternately and repeatedly. A driving means connected to a common point between the emitters of the pair of transistors operates in response to a control signal to control a current and thereby drive the transistors. The output is taken from the base potential of one of the pair of transistors. This base potential varies between two different potentials in accordance with the alternate ON and OFF states of the pair of transistors. The flow of charging and discharging currents, each of an equal current value, is applied to a capacitor connected to the base of the other of the pair of transistors. The pair of transistors are switched "ON" and "OFF" responsive to the charging and discharging of the capacitor via current mirror circuits interconnecting the pair of transistors. The control signal controls the oscillation frequency of the linear voltage controlled oscillator.

6 Claims, 6 Drawing Figures

LINEAR VOLTAGE CONTROLLED OSCILLATOR INCLUDING A TIMING CAPACITOR CHARGED AND DISCHARGED THROUGH CURRENT MIRROR CIRCUITS

BACKGROUND OF THE INVENTION

This invention relates to voltage controlled oscillators, and more particularly to a circuit organization for supplying an oscillation output signal to a phase comparator in a phase locked loop, employed for uses such as demodulation of angle-modulated waves.

In general, a voltage controlled oscillator (hereinafter referred to as a VCO) for use in a phase locked loop (hereinafter referred to as a PLL) must possess desirable properties such as a linear relationship between a control voltage applied from the outside and the output oscillation frequency, with equal duty cycles of the output oscillation waveform.

Furthermore, if a VCO is to be incorporated in a monolithic integrated circuit (IC), the VCO must have characteristics such as a not too high oscillation output voltage and an oscillation output waveform which does not contain a large quantity of harmonic components. That is, the output waveform should not have a sharp-cornered rectangular waveform, but should have rounded-off corners, in order to prevent the oscillation output of the VCO from creating an interference on other circuits within the same IC chip.

A further requirement, if the VCO is to be incorporated in a monolithic IC, is that the value of the consumed current from the +B power source, applied to the VCO, be unvarying with respect to the oscillation output. This stable current prevents the oscillation current of the VCO from imparting an effect on other circuits via the power-source circuit.

An example of a VCO heretofore used in a PLL is a Schmitt trigger circuit. In a conventional VCO of this type, however, the oscillation output voltage is high. Moreover, the current supplied from the power source varies greatly with the oscillation output. In addition, the output oscillation waveform contains a large quantity of harmonic components. Thus, a VCO of this known type has disadvantages in that it could not be incorporated in a complicated IC since it does not have properties satisfying the above mentioned requirements. For this reason, it has been difficult to adapt a VCO or a PLL containing a VCO into an IC.

SUMMARY OF THE INVENTION

Accordingly, it is a general object of the present invention to provide a new and useful circuit organization of a VCO wherein the above described difficulties have been overcome.

A specific object of the invention is to provide a circuit organization of a VCO suitable for incorporation in an IC, such as a monolithic IC.

Another object of the invention is to provide a completely novel organization of a VCO using current-mirror circuits.

Further objects and features of the invention will be apparent from the following detailed description when read in conjunction with the accompanying drawings.

DETAILED DESCRIPTION

Figure 1:
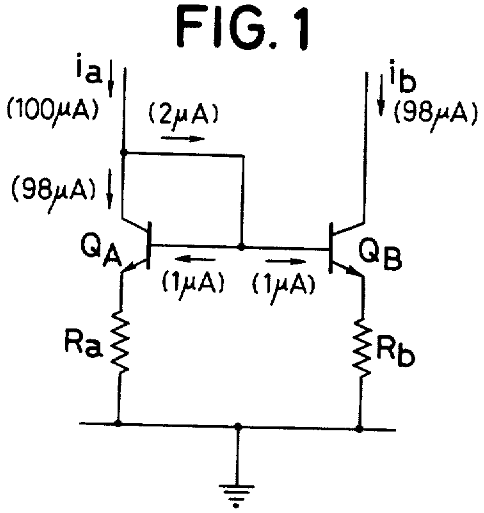
FIGS. 1, 2, and 3 are circuit diagrams respectively showing examples of ordinary current-mirror circuits.
Figure 2:
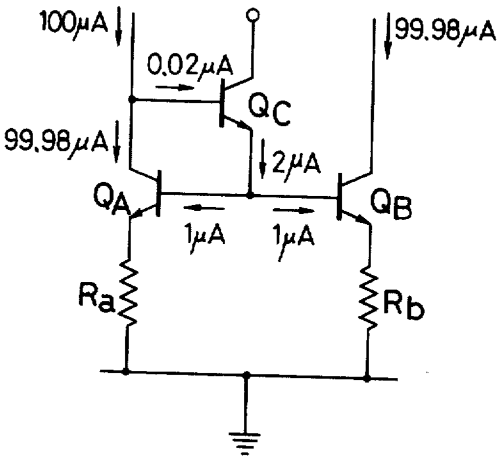
Figure 3:
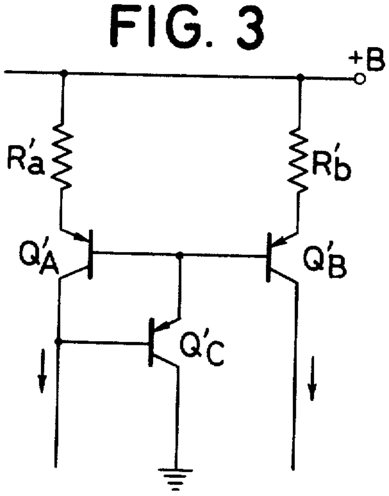

As conducive to a full understanding of the present invention, examples of current-mirror circuits used in one part of the circuit organization of the invention will be first described in a summarized manner, with reference to FIGS. 1, 2, and 3.

In FIG. 1, an ordinary current-mirror circuit includes the bases of two NPN transistors $Q_A$ and $Q_B$ which are commonly connected. The collector and base of the transistor $Q_A$ are directly connected together. The emitters of these transistors $Q_A$ and $Q_B$ are grounded by way of resistors Ra and Rb, respectively. In this circuit, current control is so effected that, when a collector current $i_a$ flows to the transistor $Q_A$, the collector current $i_b$ flowing to the transistor $Q_B$ becomes equal to the collector current $i_a$.

Current $i_b$ becomes equal to current $i_a$ in an ideal transistor, wherein the current amplification factor $\beta$ ( Hfe ) is infinite. In actual practice, a base current is approximately one one-hundredth of the collector current $i_a$. Thus, an error of approximately twice this fraction, that is, one fiftieth, is produced between these currents $i_a$ and $i_b$. For example, if $\beta = 100$, and a collector current of 100 $\mu$A flows, a current of 1 $\mu$A flows to each of the bases of the transistors $Q_A$ and $Q_B$. The current flowing into the collector of the transistor $Q_A$ actually becomes 98 $\mu$A. Accordingly, the current of the transistor $Q_B$ also becomes 98 $\mu$A, and as an ultimate result, an error of 2 $\mu$A, that is, $2/\beta$, is produced with respect to 100 $\mu$A.

Accordingly, the circuit illustrated in FIG. 2 is an improvement on this point. The base and emitter of a transistor $Q_C$ are connected respectively to the collector and base of a transistor $Q_A$. In other respects, the organization of this circuit is the same as that of the circuit shown in FIG. 1. For the emitter current flowing through the emitter of the transistor $Q_C$ to be 2 $\mu$A in FIG. 2, the current flowing to the base thereof is 0.02 $\mu$A. As a result, the current flowing to the collectors of the transistors $Q_A$, $Q_b$, becomes 99.98 $\mu$A. Therefore, in FIG. 2, the above mentioned collector current error becomes $2/\beta 2$, which is two ten-thousandths when $\beta = 100$. This is a very small quantity, whereby the currents $i_a$ and $i_b$ may be considered to be substantially equal.

In the circuit of the above described example, NPN-type transistors are used for the transistors $Q_A$, $Q_B$, and $Q_C$. It is also possible to use PNP-type transistors, in which case the circuit of FIG. 3 is used instead of that shown in FIG. 2. The current amplification factor $\beta$ of a lateral PNP transistor varies with the collector current. For example, for collector currents of 200 $\mu$A, 400 $\mu$A, and 800 $\mu$A, the current amplification factor $\beta$ becomes 20, 8, and 2, respectively. This factor differs with whether the transistor used is of the lateral PNP type or the vertical PNP type. A vertical PNP transistor type can be used for the transistor $Q_C$. The transistors $Q_A$ and $Q_B$ necessarily must be of the lateral PNP type.

In FIG. 3, the collector current error is $2/(\beta 1 \times \beta 2)$ (where $\beta 1$ is the current amplification factor of the transistors $Q_A'$ and $Q_B'$, and $\beta 2$ is the current amplification factor of the transistor $Q_C'$). For example, when the collector current is 200 $\mu$A, the collector current error becomes 2/400 = 0.5 percent. In this circuit, also, the collector currents of the two transistors $Q_A'$ and $Q_B'$ may be considered to be substantially equal.

The organization and operation of one embodiment of a voltage controlled oscillator, according to the present invention, in a part of which current-mirror circuits as described above are used, will now be described in conjunction with FIGS. 4 and 5.

First, in this circuit organization, a control voltage is applied through a terminal T to the base of a transistor $Q_1$. This control voltage is, for example, the output of a phase comparator of a PLL. The control voltage has passed through circuits such as an amplifier, a low-pass filter, and a variable time constant circuit, for example.

The emitters of transistors $Q_2$ and $Q_3$ are connected commonly to each other and to the collector of the transistor $Q_1$. A capacitor C is connected between the base of the transistor $Q_2$ and ground. According to the present invention, the VCO is to be incorporated in a monolithic IC together with other circuits. This capacitor C may be connected outside of the IC instead of building it within the IC.

The circuit further has transistors $Q_4$, $Q_5$, and $Q_6$ constituting a current-mirror circuit, as shown in principle in FIG. 3. In addition, transistors $Q_7$, $Q_8$, $Q_9$, and $Q_{10}$ and transistors $Q_{11}$, $Q_{12}$, $Q_{13}$, and $Q_{14}$ respectively constitute modifications of the above described current-mirror circuit. Here, the base, emitter, and collector of the transistor $Q_9$ are connected respectively to the bases of the transistors $Q_7$ and $Q_8$, to a power source terminal P, and to the capacitor C. Furthermore, the base, emitter, and collector of the transistor $Q_{12}$ are connected respectively to the bases of the transistors $Q_{11}$ and $Q_{13}$, to ground, and to the capacitor C. In these modified current-mirror circuits, the collector currents are respectively equal among the transistors $Q_7$, $Q_8$, and $Q_9$ and transistors $Q_{11}$, $Q_{12}$, and $Q_{13}$.

The collectors of the transistors $Q_8$ and $Q_{13}$ are respectively connected to a junction point S by way of resistors $R_1$ and $R_2$ of relatively high resistance values. The base of the transistor $Q_3$ is also connected to junction point S. Between the power source terminal P and ground, resistors $R_4$ and $R_5$ are connected in series. A resistor $R_3$ is connected from the junction point T between these resistors $R_4$ and $R_5$ to the junction point S.

The above described circuit operates as follows.

When a certain control voltage $V_1$ is applied through the terminal T to the base of the transistor $Q_1$, a current flows to the collector of the transistor $Q_1$. The value of this collector current $i_1$ is controlled in accordance with the value of the control voltage $V_1$.

As a consequence of this flow of the collector current to the transistor $Q_1$, the transistors $Q_2$ or $Q_3$, having the higher base potential, is switched ON, while that transistor with the lower base potential is switched OFF.

If the transistor $Q_2$ thus switches ON, the collector currents $i_1$, $i_2$, and $i_3$ of the transistors $Q_1$, $Q_2$, and $Q_3$ will have the following relationships:

$$i_1 = i_2,\ i3 = 0$$

Furthermore, as a result of the operation of the current-mirror circuits, the following relationships will be valid between the collector currents $i_4$, $i_5$, $i_{11}$, $i_{12}$, and $i_{13}$ of the transistors $Q_4$, $Q_5$, $Q_{11}$, $Q_{12}$, and $Q_{13}$:

$i_4\ (= i_2\ ) = i_5$, and $i_{11}\ (= i_5\ ) = i_{12} = i_{13}$

Accordingly, $i_1 = i_2 = i_4 = i_5 = i_{11} = i_{12} = i_{13}$.

On the other hand, the currents $i_3$, $i_7$, $i_8$, and $i_9$ of the transistors $Q_3$, $Q_7$, $Q_8$, and $Q_9$ will all be equal to zero.

Therefore, when the transistor $Q_2$ is ON, and the transistor $Q_3$ is OFF, for example, a discharge current $i_{12}$ flows from the capacitor C, and a collector current $i_1$ flows to the transistor $Q_1$.

Conversely, when the transistor $Q_2$ is OFF, and the transistor $Q_3$ is ON:

$i_1 = i_3 = i_7 = i_9$, and $i_2 = i_5 = i_{12} = 0$

Therefore, in this case, a charging current $i_9$ flows to the capacitor C.

As a result, a discharging current $i_{12}\ (= i_1\ )$ and a charging current $i_9\ (= i_1\ )$ flow alternately in the capacitor C in accordance with the alternate ON and OFF states of the transistors Q2 and Q3.

The potential at the point S, connected to the base of the transistor $Q_3$, will be considered. For this purpose, it will be assumed that the resistance values of the above mentioned resistors R1 through R5 have been selected as follows:

$R_1 = R_2 = 25\ k\Omega$, $R_3 = 5\ k\Omega$, $R_4 = R_5 = 1.5\ k\Omega$

The potential of the junction point T is set as a result of the potential division of the voltage divider traced from +B (6V) through the resistors $R_4$ and $R_5$ (where, $R_4 = R_5$), that is, is one-half of 6V or 3V.

Then, when the transistor $Q_2$ is ON, and the transistor $Q_3$ is OFF, the current-mirror circuit of the transistors $Q_{11}$, $Q_{12}$, and $Q_{13}$ tends to cause the flow of currents $i_{11} = i_{13} = i_1$. However, the potential at the point T is 3V even where $i_1 = 200\ \mu$A, 200 $\mu$A does not flow as the current $i_{13}$. Instead a current $i_{13}$ of the following value flows:

$$i_{13} = 3/[(25 + 5) \times 10^3] = 100\ (\mu A)$$

Since the current flows from the point T toward the point S at this time, the potential at the point S becomes $$3 - (5 \times 10^3 \times 100 \times 10^{-6}\ ) = 2.5\ V.$$

Therefore, even if the current $i_1$ is higher than 100 $\mu$A, the potential of the point S remains constant. At this time, $i_8 = 0$.

Similarly, when the transistor $Q_3$ is ON, the current $i_{13}$ is zero, and the current $i_8$ becomes 100 $\mu$A. Then since the current flows from the point S toward the point T, the potential of the point S becomes $3 + (5 \times 10^3 \times 100 \times 10^{-6}\ ) = 3.5$ V.

Thus, when the transistor $Q_3$ is OFF, its base potential becomes 2.5 V, whereas when it is ON, its base potential becomes 3.5 V. Furthermore, as mentioned above, a discharging current of $i_{12} = i_1$ flows from the capacitor C when the transistor $Q_3$ is OFF. A charging current of $i_9 = i_1$ flows thereto when the transistor $Q_3$ is ON.

Figure 5:
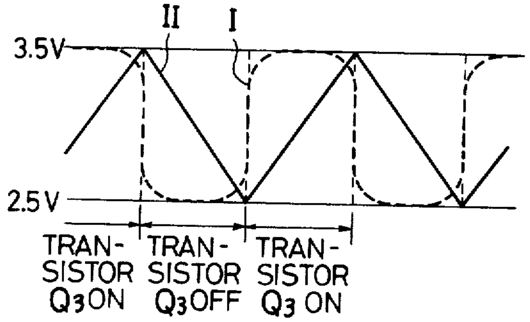
FIG. 5 is a graphical diagram indicating the waveform of the base voltage of paired transistors here given for the circuit shown in FIG. 4.

This operational feature is indicated in FIG. 5. In this figure, the rectangular wave is shown by the broken line I which represents the base potentials of the transistor $Q_3$ resulting from the ON and OFF states of the transistor $Q_3$, that is, the variation of the potential at the point S. This potential is indicated as being 3.5 V when the transistor $Q_3$ is ON and 2.5 V when the transistor $Q_3$ is OFF.

Then, as mentioned above, a charging current of $i_9 = i_1$ flows in the capacitor C when the transistor $Q_3$ is ON. At this time, the potential at the junction point between the base of the transistor $Q_2$ and the capacitor C rises with a gradient determined by the current $i_9$ ( $= i_1$ ) and the capacitance of the capacitor C. Then, when the base potential of the transistor $Q_2$ rises in this manner and reaches a value higher than 3.5 V, the transistor $Q_2$ switches ON, while the transistor $Q_3$ switches OFF.

As a result of the OFF state of the transistor $Q_3$, its base potential becomes 2.5 V, and a discharging current $i_{12} = i_1$ flows from the capacitor C. As a result, the base potential of the transistor $Q_2$ decreases gradually with a gradient which is the reverse of the gradient of the above mentioned rise. Then, when this base potential of the transistor $Q_2$ becomes less than 2.5 V, the transistor $Q_2$ switches OFF. The transistor $Q_3$ switches ON, whereby the state of the circuit is inverted.

The above described variations of the base potential of the transistor $Q_2$ is indicated by full line II in FIG. 5. Since, the charging and discharging currents $i_9$ and $i_{12}$ are equal in this case, the duty cycles of the ON and OFF states of the transistors $Q_2$ and $Q_3$ are equal, whereby these duty cycles are one-half, that is, 50 percent.

Thus, the VCO continues its oscillation by producing an oscillation output of a duty cycle of 50 percent. The circuit frequency of this oscillation is determined by the current $i_1$ ( $= i_9 = i_{12}$ ) and the capacitance of the capacitor C. A desired oscillation can be obtained by setting the control voltage V1 at an appropriate value so as to cause the necessary current $i_1$ to flow.

Here, the current $i_1$ and the oscillation frequency have a linear, proportional relationship. Furthermore, the current $i_1$ and the control voltage $V_1$ also have a linear, proportional relationship. Therefore, the oscillation frequency and the control voltage $V_1$ have a linear, proportional relationship.

The collector currents of the transistors $Q_8$ and $Q_{13}$ flow through the high resistance (25 kΩ) resistors $R_1$ and $R_2$. Furthermore there are capacitance components between the base and emitter and between the base and collector of the transistor $Q_3$which cause the response speed of the variation of the base voltage of the transistor $Q_3$ to become slow. The waveform of this base voltage becomes a rectangular wave with dull, rounded corners between its rising part and its falling part as indicated by the broken line I in FIG. 5. In this connection, the fact that the corners of a rectangular wave are sharp means that it contains many harmonic components. The roundness of the corners of a rectangular wave means that an oscillation output with few harmonic components can be obtained as the output of the VCO.

The oscillation output of the VCO itself is led out through the points S and T and supplied to a phase comparator (not shown) of the PLL.

The oscillation output voltage within the voltage controlled oscillator circuit is held at the sum of the forward diode voltages (0.7 V) between the bases and emitters of two silicon transistors (e.g., $Q_4$ and $Q_6$), that is, at a value of 1.4 Vp-p as a maximum. Therefore, when the above described circuit is incorporated within a monolithic IC together with another circuit, its oscillation output does not have a deleterious effect on the other circuit. Furthermore, the variation in the consumed current from the +B power source to the VCO is of the order of less than 50 μA, for example, which is a very small current variation.

In a PLL in a demodulator for discrete four channel record discs, the center of its lock range characteristic is selected at 30 KHz which is equal to the carrier wave frequency of an angle modulation wave signal. Then, in order to prevent the PLL locking, by error, to a component of a direct-wave sum signal of a frequency band from 0 to 15 KHz or erroneously locking to a signal of 10 KHz at the time when a record disc starts to rotate from a stopped state with the stylus resting thereon, it is desirable that the lock range PLL be so set beforehand that it is not spread to less than 20 KHz or less than 15 KHz.

The current corresponding to an oscillation frequency of 30 KHz is 200 μA in the case where the VCO circuit of the present invention is applied to a PLL, wherein the lock range is set in this manner. Then the values of the above mentioned collector currents $i_8$ and $i_{13}$ are determined by the lower limiting frequency of the above mentioned lock range characteristic. For example, in the case where the limiting frequency of the lock range is 15 KHz, the currents $i_8$ and $i_{13}$ are selected at 100 μA.

Figure 6:
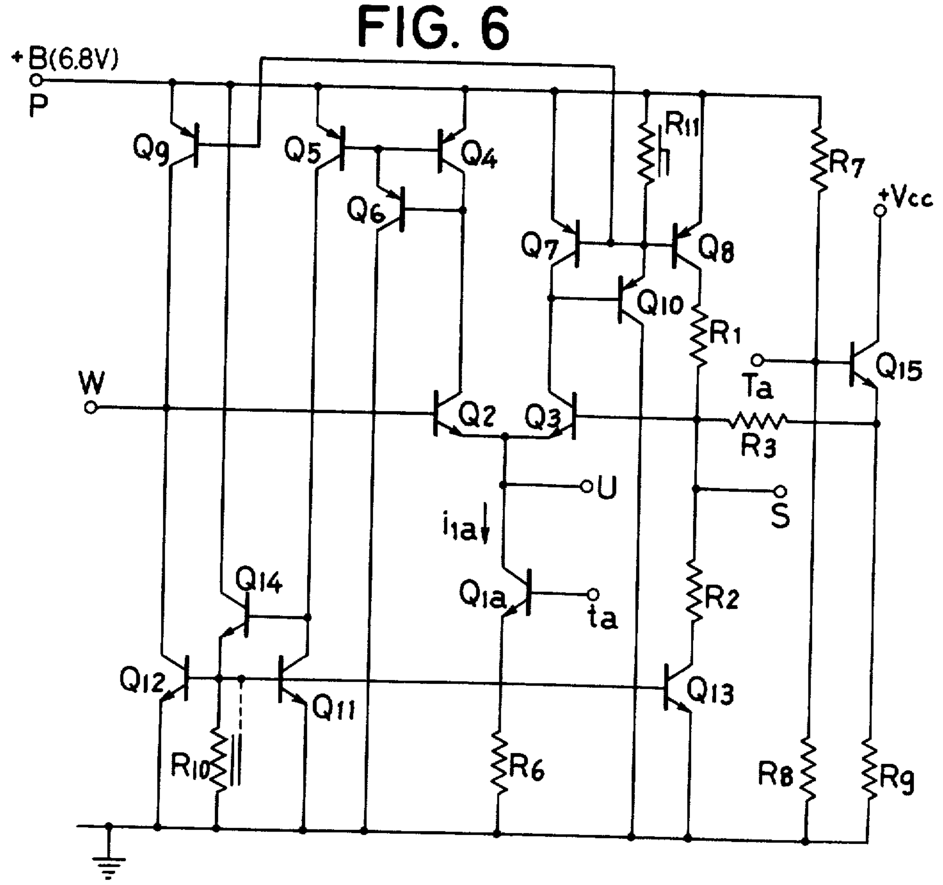
FIG. 6 is a circuit diagram of another embodiment of a VCO according to the present invention.

Another embodiment of a voltage controlled oscillator circuit, according to the invention, actually incorporated in a monolithic IC as a VCO circuit of a PLL circuit in an integral manner with another circuit of the PLL will now be described with reference to FIG. 6. Those parts in FIG. 6 which are the same as those in FIG. 4 are designated by like reference symbols and will not be described in detail again.

Figure 4:
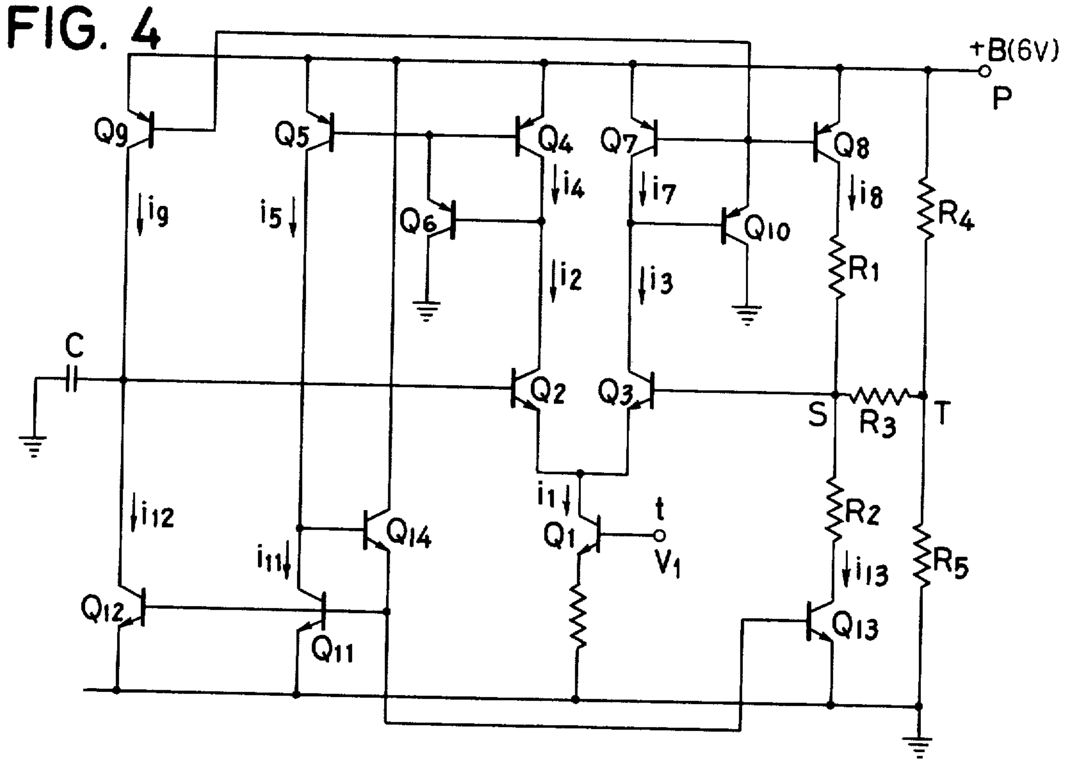
FIG. 4 is a circuit diagram of one embodiment of a VCO according to the present invention.

In the embodiment of the circuit illustrated in FIG. 4, a control voltage is applied to the base of the transistor $Q_1$, thereby to cause the transistor $Q_1$ to operate as a sort of current feedback amplifier, and the value of the current $i_1$ is controlled. In the instant embodiment circuit shown in FIG. 6, however, a constant bias voltage is applied through a terminal T*a* on the base of a transistor $Q_{1a}$ to cause a constant collector current to flow through the transistor $Q_{1a}$. A current-control circuit (not shown) is connected by way of a terminal U between the collector of the transistor $Q_{1a}$ and the emitters of transistors $Q_2$ and $Q_3$. This current-control circuit operates to control the current $i_{1a}$ flowing in the transistor $Q_{1a}$. This current-control circuit is controlled by the output of the phase comparator of the PLL.

An emitter-follower transistor $Q_{15}$ is connected between the output terminal T*a* and the resistor $R_3$.

Furthermore, the capacitor C in the above described embodiment is connected to a terminal W from outside of the IC circuitry.

The constants (resistance values) of the resistors in the circuit organization in this embodiment are as follows.

| | | | | | |
|---|---|---|---|---|---|
| $R_1$ | 20 | kΩ | $R_2$ | 40 | kΩ |
| $R_3$ | 3 | do. | $R_6$ | 2.4 | do. |
| $R_7$ | 1.3 | do. | $R_8$ | 4.7 | do. |
| $R_9$ | 4 | do. | $R_{10}$ | 10 | do. |
| $R_{11}$ | 10 | do. | | | |

In the circuit organization according to the present invention, the values of the currents $i_1$ and $i_{1a}$ are controlled thereby to control the oscillation frequency. For this reason, the term "voltage controlled oscillator (VCO)" as herein used may be expressed as "current controlled oscillator (ICO)" and should not be interpreted in a limited sense in view of the terminology provided that it is within the intended purview and concept of the present invention.

Further, this invention is not limited to these embodiments but various variations and modifications may be made without departing from the scope and spirit of the invention.

What is claimed is:

1. A linear voltage controlled oscillator comprising:

a power source;

a pair of transistors having mutually connected emitter electrodes, the base electrode of one of the transistors being connected to a capacitor;

first current-mirror circuit means connected between said power source and the collector electrode of the other of the pair of transistors, said first current-mirror circuit means being coupled to the base electrode of the other of the pair of transistors through a first resistor and also coupled to charge the capacitor during intervals while the other of the pair of transistors is conductive;

second current-mirror circuit means connected between said power source and the collector electrode of said one of the pair of transistors;

third current-mirror circuit means connected between said second current-mirror circuit means and ground, said third current-mirror circuit means being coupled to the base electrode of the other of the transistors through a second resistor and also coupled to discharge the capacitor during intervals while said one of the pair of transistors is conductive;

bias circuit means connected between said power source and ground, said bias circuit means being coupled to the base electrode of the other of the pair of transistors through a third resistor;

a third transistor connected between the emitter electrodes of said pair of transistors and ground, and means responsive to a control voltage for controlling the current through the third transistor and therefore through said pair of transistors, whereby an oscillating frequency is controlled by a charging current to and a discharging current from the capacitor.

2. A linear voltage controlled oscillator as defined in claim 1 wherein the resistance values of the first and second resistors are larger than the resistance value of the third resistor.

3. A voltage controlled oscillator comprising: a pair of transistors having their emitters connected together in parallel, said transistors being alternately and repeatedly switched ON and OFF; driving transistor means connected in series with the parallel connected emitters of said pair of transistors, means for operating said driving transistor means in response to an external control signal applied to the base of the driving transistor to control the current value in the parallel emitters for driving said pair of transistors; means operating responsive to the alternate ON and OFF states of said pair of transistors to cause the base potential of one of said pair of transistors to vary between two different potential values; resistors of high resistance value each of which has one side connected to the base of said one of said pair of transistors, the base of the other of said pair of transistors being connected to a capacitor, means for repeatedly charging and discharging said capacitor; and current-mirror circuits for causing the flow of said charging and discharging currents with a current value equal to the current value of said driving means, the other side of each of said resistors being connected to said current-mirror circuits.

4. The voltage controlled oscillator as set forth in claim 3 wherein all of the named circuit elements except the capacitor are incorporated within an integrated circuit, said capacitor being disposed outside of said integrated circuit, and an external terminal attached to said integrated circuit for connecting said capacitor to the base of said other of said pair of transistors.

5. The voltage controlled oscillator as set forth in claim 3 in which said high resistance value is selected to cause the corners of the oscillation output waveform to have a bluntly rounded somewhat rectangular shape.

6. A voltage controlled oscillator comprising: a pair of transistors having their emitters connected together in parallel, said transistors being alternately and repeatedly switching ON and OFF; driving transistor means connected in series with the parallel connected emitters of said pair of transistors, said driving transistor means comprising a dynamic biasing circuit connected to the parallel circuit of the emitters of said pair of rransistors, means transistors, to said driving transistor means for causing a constant current in said pair of transistors when a specific bias voltage is applied on the base thereof, control means effectively coupled between said driving transistor and the emitters of said pair of transistors and operating in response to a control signal to vary the value of said constant current; means operating responsive to the alternate ON and OFF states of said pair of transistors to cause the base potential of one of said pair of transistors to vary between two different potential values; resistors of high resistance value, each resistor having one side connected to the base of said one of said pair of transistors, the base of the other of said pair of transistors being connected to a capacitor, means for repeatedly charging and discharging said capacitor; and current-mirror circuits for causing the flow of said charging and discharging currents with a current value equal to the current value of said driving means, the other sides of said resistors being connected to said current-mirror circuits.

* * * * *